United States Patent
Chen et al.

(10) Patent No.: US 12,328,944 B2
(45) Date of Patent: Jun. 10, 2025

(54) LAYOUT OF INTEGRATED CIRCUIT

(71) Applicant: UNITED MICROELECTRONICS CORP., Hsin-Chu (TW)

(72) Inventors: Ruei-Yau Chen, Pingtung County (TW); Wei-Jen Wang, Tainan (TW); Kun-Yuan Wu, Kaohsiung (TW); Chien-Fu Chen, Miaoli County (TW); Chen-Hsien Hsu, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 387 days.

(21) Appl. No.: 17/517,642

(22) Filed: Nov. 2, 2021

(65) Prior Publication Data

US 2023/0095481 A1 Mar. 30, 2023

(30) Foreign Application Priority Data

Sep. 28, 2021 (TW) .................................. 110135987

(51) Int. Cl.
H10D 89/10 (2025.01)
(52) U.S. Cl.
CPC .................................. H10D 89/10 (2025.01)
(58) Field of Classification Search
CPC ............... H01L 27/0207; H01L 27/092; H01L 27/11807; H01L 27/088; H01L 2027/11874; H01L 29/4238; H10D 89/10
See application file for complete search history.

(56) References Cited

U.S. PATENT DOCUMENTS

| | | | |
|---|---|---|---|
| 7,302,660 B2 | 11/2007 | Shimamura | |
| 7,943,966 B2 | 5/2011 | Becker | |
| 8,698,205 B2 | 4/2014 | Tzeng | |
| 2005/0280031 A1* | 12/2005 | Yano | H01L 27/11807 257/210 |
| 2011/0133253 A1 | 6/2011 | Nakanishi | |
| 2018/0004882 A1 | 1/2018 | Hsieh | |
| 2019/0123063 A1 | 4/2019 | Hino | |
| 2020/0328201 A1* | 10/2020 | Li | H01L 21/8221 |
| 2020/0411063 A1* | 12/2020 | Fujiwara | H10B 10/12 |

FOREIGN PATENT DOCUMENTS

| | | |
|---|---|---|
| JP | 2011-134838 A | 7/2011 |
| TW | 202129529 A | 8/2021 |
| TW | 202131216 A | 8/2021 |
| TW | 202131218 A | 8/2021 |
| TW | 202133020 A | 9/2021 |
| WO | 2012/023247 A1 | 2/2012 |

* cited by examiner

*Primary Examiner* — Timor Karimy
(74) *Attorney, Agent, or Firm* — Winston Hsu

(57) ABSTRACT

An integrated circuit layout includes a first and a second standard cells abutting along a boundary line. The boundary line and a first active region of the first standard cell include a distance D1. A first gate line on the first active region protrudes from the first active region by a length L1. The boundary line and a second active region of the second standard cell include a distance D2. A second gate line on the second active region protrudes from the second active region by a length L2. Two first dummy gate lines and two second dummy gate lines are disposed at two sides of the first active region and the second active region and are away from the boundary line by a distance S. The lengths L1 and L2, the distances S, D1 and D2 have the relationships: L1≤D1−S, L2≤D2−S, and D1≠D2.

10 Claims, 10 Drawing Sheets

LAYOUT OF INTEGRATED CIRCUIT

BACKGROUND OF THE INVENTION

1. Field of the Invention

The present invention relates to an integrated circuit layout. More particularly, the present invention relates to an integrated circuit layout including standard cells having a same cell height but different active region widths.

2. Description of the Prior Art

As the needs for better performance and various applications are increased, the integrated circuits (ICs) has become more and more complicated and usually includes hundreds of thousands or millions of logic gates. In the industry, to facilitate circuit design process, circuit units of specific functions commonly used in an integrated circuit are usually designed into standard cells with logic gates, such as NAND cells, NOR cells, d-flip-flop cells, latch cells, I/O cells, OP amplifier cells, ADC cells, DAC cells. After verifying the manufacturability for mass production of the standard cells, standard cell libraries including the verified standard cells may be authorized to the chip designers to construct functional circuitries by utilizing automated computer-aided design (CAD) tools such as logic simulator, logic synthesizer, and automatic placer & router. In this way, a complex and large integrated circuit may be correctly constructed within a short period of time.

A standard cell library of a specific function usually includes standard cells designed for different powers which may be mix used by the chip designer in a flexible way to obtain a desire performance. When the standard cells have different cell heights, mix using the standard cells may easily produce irregular patterns and useless blank areas in the layout. This not only causes a waste of space, but also reduces the efficiency of the automated layout process due to the lower pattern regularity. To resolve the above problems, a common approach taken currently is to put the standard cells with different cell heights into different routing blocks and electrically connect the standard cells by metal interconnections. However, this has adversely limited the design flexibility. The extended length of the metal interconnections may also increase the power loss.

SUMMARY OF THE INVENTION

The present invention is directed to provide standard cells and an integrated circuit layout including the standard cells which may have an improved design flexibility and manufacturability.

According to an embodiment of the present invention, an integrated circuit layout includes a first row of standard cells and a second row of standard cells abutting along a boundary line extending along a first direction. A first standard cell of the first row of standard cells includes a first active region, a first gate line disposed on the first active region, and two first dummy gate lines disposed at two sides of the first active region. The first active region includes an edge extending along the first direction and adjacent to the boundary line. The first gate line extends along a second direction to protrude from the edge of the first active region by a length L1. The two first dummy gate lines are parallel to the first gate line. A second standard cell of the second row of standard cells includes a second active region, a second gate line disposed on the second active region, and two dummy gate lines disposed at two sides of the first active region. The second active region includes an edge extending along the first direction and adjacent to the boundary line. The second gate line extends along the second direction to protrude from the edge of the second active region by a length L2. The two second dummy gate lines are parallel to the second gate line. The first direction and the second direction are perpendicular. The two first dummy gate lines and the two second dummy gate lines are respectively away from the boundary line by a distance S, the edge of the first active region is away from the boundary line by a distance D1, the edge of the second active region is away from the boundary line by a distance D2. The length L1, the length L2, the distance S, the distance D1 and the distance D2 include the relationships:

$$L1 \leq D1 - S;$$

$$L2 \leq D2 - S; \text{ and}$$

$$D1 \neq D2.$$

According to another embodiment of the present invention, an integrated circuit layout includes an upper cell boundary, an upper active region adjacent to the upper cell boundary, a first gate line and a second gate line disposed on the upper active region, and two dummy gate lines disposed at two sides of the upper active region. The upper cell boundary extends along a first direction. The upper active region includes a first edge and a second edge extending along the first direction and adjacent to the upper cell boundary, wherein the first edge is away from the upper cell boundary by a distance D3, the second edge is away from the upper cell boundary by a distance D4. The first gate line extends along a second direction to protrude from the first edge of the upper active region by a length L3. The second gate line extends along the second direction to protrude from the second edge of the upper active region by a length L4. The two dummy gate lines extend along the second direction and are away from the upper cell boundary by a distance S. The first direction and the second direction are perpendicular. The distance D3, the distance D4, the distance S, the length L3 and the length L4 include the relationships:

$$L3 \leq D3 - S;$$

$$L4 \leq D4 - S; \text{ and}$$

$$D3 \neq D4.$$

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are schematic drawings and included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size and are not necessarily drawn to scale, for the sake of clarity and convenience in the drawings. The same reference signs are generally used to refer to corresponding or similar features in modified and different embodiments.

DETAILED DESCRIPTION

Figure 1:
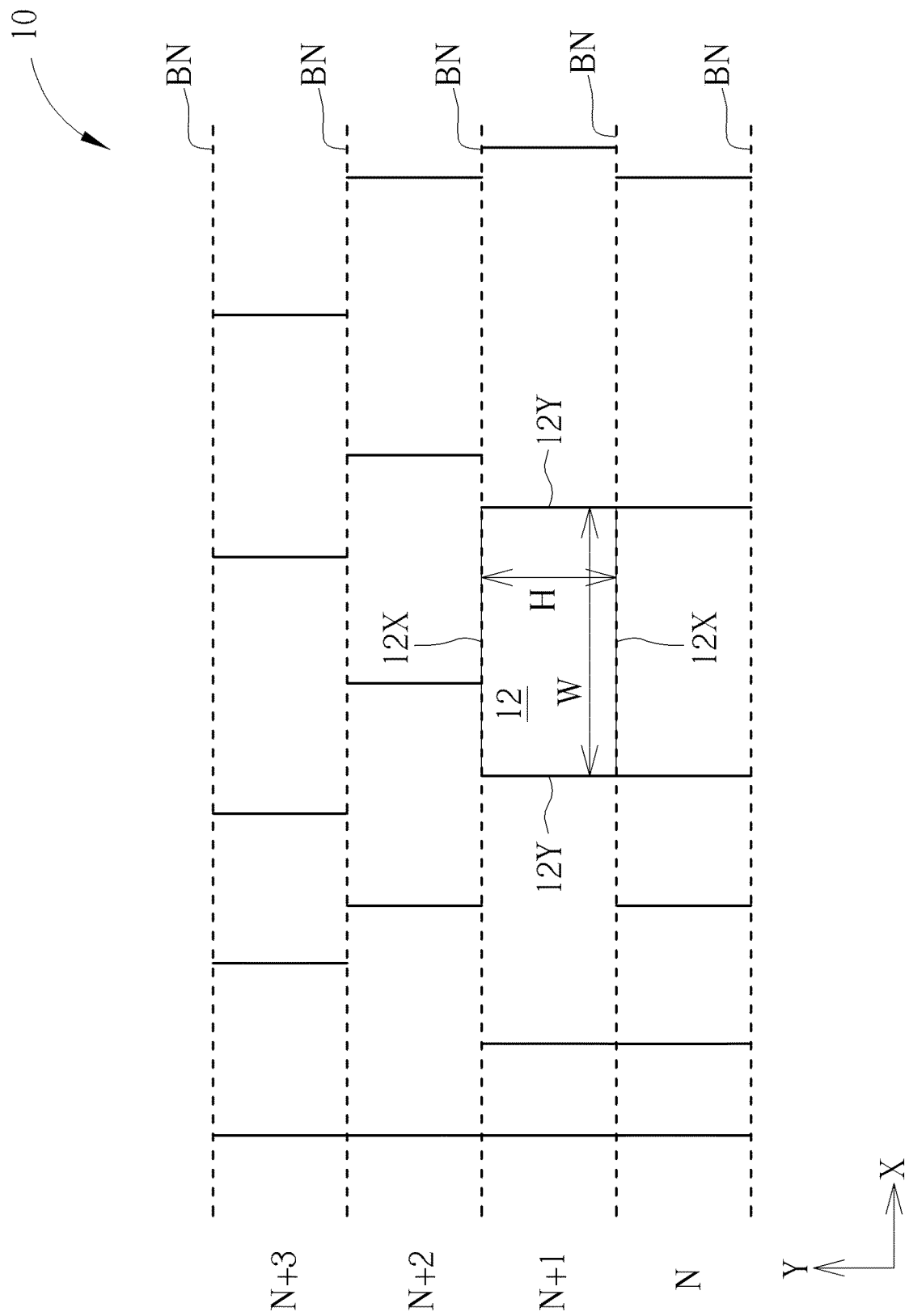
FIG. 1 is a schematic plan view of an integrated circuit layout according to an embodiment of the present invention.

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

For the convenience of illustrating the spatial relationships of the features, the first direction X and the second direction Y which are perpendicular to each other are shown in the drawing. In addition to the orientation shown in the drawings, other orientations (for example, rotated by 90 degrees or other directions) of the present invention may also be explained by the spatially relative descriptions in the specification. It should be noted that the term "gate line width" refers to a width of a gate line taken along the first direction X. The term "dummy gate line width" refers to a width of a dummy gate line taken along the first direction X. The term "gate line length" refers to a length of a gate line taken along the second direction Y. The term "dummy gate line length" refers to a length of a dummy gate line taken along the second direction Y. The term "gate line pitch" refers to a space between the gate lines taken along the first direction X. The term "active region width" refers to a width of an active region taken along the second direction Y. The term "cell width" refers to a width of a standard cell taken along the first direction X. The term "cell height" refers to a height of a standard cell taken along the second direction Y.

The numbers of the gate lines and/or fin structures of the standard cells in the embodiments of the present invention are only examples, and may be modified in other embodiments without departing from the scope of the present invention. The number of the gate lines and/or fin structures of the present invention may be single or plural.

Please refer to FIG. 1, which shows a schematic plan view of an integrated circuit layout 10 according to an embodiment of the present invention. The integrated circuit layout 10 includes plural rows of standard cells abutting along the boundary lines BN. FIG. 1 shows the N row, the N+1 row, the N+2 row and the N+3 row of standard cells, wherein N is a positive integer greater than 1. The boundary lines BN are extending along first direction X. The rows of standard cells are arranged along the second direction Y and are parallel to each other. The first direction X and the second direction Y are perpendicular. The integrated circuit layout 10 may include standard cells with different power arranged in a same row or different rows.

In FIG. 1, a standard cell 12 of the integrated circuit layout 10 is labeled with reference signs for the convenience of illustration. The standard cell 12 includes two cell boundaries 12X that extend along the first direction X and two cell boundaries 12Y that extend along the second direction Y. The cell boundaries 12X overlap the boundary lines BN. The cell boundaries 12Y extend between the boundary lines BN. A cell height H of the standard cell 12 equals to the length of the cell boundaries 12Y or the distance between the cell boundaries 12X. A cell width W of the standard cell 12 is equal to the length of the cell boundaries 12X or the distance between the cell boundaries 12Y. The standard cells 12 of the integrated circuit layout 10 have a same cell height H, and may have different cell width W. The integrated circuit layout 10 may include standard cells 12 with different powers.

Figure 2:
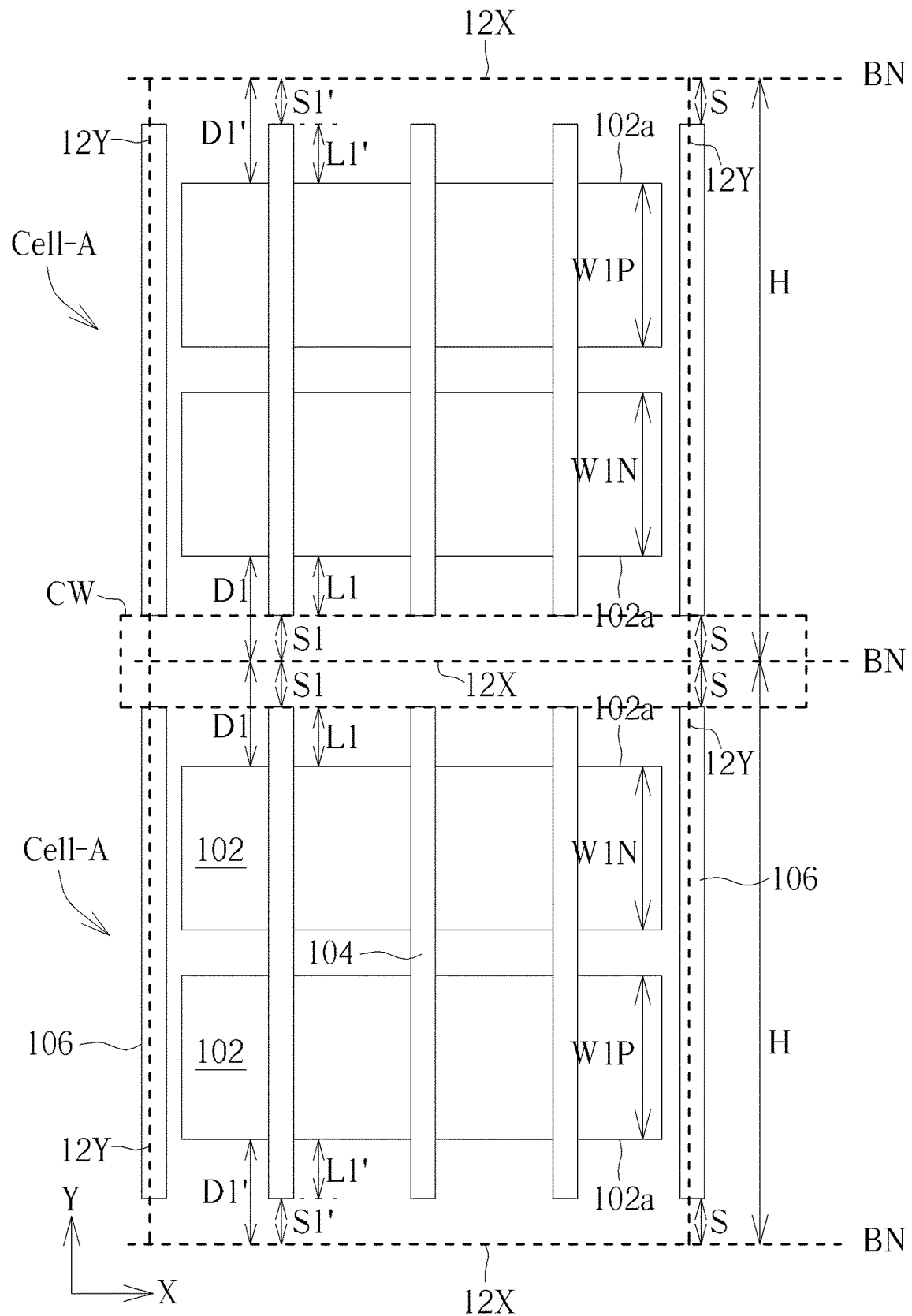
FIG. 2 is a partial enlarged plan view of an integrated circuit layout according to an embodiment of the present invention.

Please refer to FIG. 2, which is a partial enlarged plan view of an integrated circuit layout 10 according to an embodiment of the present invention. The integrated circuit layout 10 includes two standard cells Cell-A respectively disposed in two adjacent rows (such as the N row and the N+1 row shown in FIG. 1) and abutting along a boundary line BN. The left side and right side of the standard cell Cell-A along the first direction X may abut to other standard cells of the same row. The upper side or lower side of the standard cell Cell-A along the second direction Y may abut to another standard cell of another adjacent row. To simplify the drawing, other standard cells are not shown in FIG. 2. The standard cell Cell-A includes two cell boundaries 12X that extend along the first direction X and two cell boundaries 12Y that extend along the second direction Y. The cell boundaries 12X overlap the boundary lines BN. The cell boundaries 12Y extend between the boundary lines BN. The standard cell Cell-A has a cell height H. According to an embodiment, the standard cell Cell-A is a high performance cell.

The standard cell Cell-A includes two active regions 102 arranged along the second direction Y. The active regions 102 of the standard cell Cell-A respectively include an edge 102a that is adjacent to the boundary line BN and extends along the first direction X. The edges 102a of the active regions 102 are away from the boundary lines BN by a distance D1 and a distance D1', respectively.

According to an embodiment of the present invention, the two active regions 102 of the same standard cell Cell-A may have opposite conductivity types, and the active regions 102 at two sides of the boundary line BN and belonging to different standard cells Cell-A may have a same conductivity type. For example, in some embodiments, the two active regions 102 at two sides of the boundary line BN in the middle portion of FIG. 2 may have an n-type conductivity type, and the other two active regions 102 adjacent to the boundary lines BN in the upper portion and lower portion of FIG. 2 may have a p-type conductivity type. In other embodiments, the two active regions 102 at two sides of the boundary line BN in the middle portion of FIG. 2 may have a p-type conductivity type, and the other two active regions 102 adjacent to the boundary lines BN in the upper portion and lower portion of FIG. 2 may have an n-type conductivity type.

The active regions 102 of the standard cell Cell-A may respectively have an active region width W1N and an active region width W1P. The active region width W1N and an active region width W1P may be the same or different according to design needs to obtain desired electrical performance. In some embodiments, the active region width W1N and the active region width W1P may be the same. In other embodiments, the active region width W1N and the active region width W1P are different. The distance D1 and the distance D1' may be adjusted according to the active region width W1N and the active region width W1P, and may be the same or different.

As shown in FIG. 2, each standard cell Cell-A includes a plurality of gate lines 104 that are arranged in parallel and equally spaced (away from each other by a gate line pitch) along the first direction X and extend along the second direction Y to cross the active regions 102 of the standard cell Cell-A. The standard cell Cell-A also includes two dummy gate lines 106 disposed at two sides of the active regions 102. The dummy gate lines 106 extend along the second direction Y and are parallel to the gate lines 104. According to an embodiment of the present invention, the dummy gate lines 106 may be away from the gate lines 104 by the gate line pitch of the gate lines 104. The overlapping regions of the active regions 102 and the gate lines 104 are the channel regions of the transistors of the standard cell Cell-A. The currents of the channel regions and the ON or OFF states of the transistors are controlled by the gate lines 104. It is noteworthy that the line ends (end-caps) of the gate lines 104 of the standard cell Cell-A respectively protrude from the edges 102a of the active regions 102 by a length L1 and a length L1' and are away from the boundary lines BN by a distance S1 and a distance S1'. The distance S1, the distance D1 and the length L1 have the relationship: S1=D1−L1. The distance S1', the distance D1' and the length L1' have the relationship: S1'=D1'−L1'. The length L1 and the length L1' may be referred to as end-cap lengths of the gate lines 104. It is important that the length L1 and the length L1' are larger than a minimum design rule of the integrated circuit layout 10 (for example, 25 nm, 30 nm, 35 nm, 40 nm, 45 nm, 50 nm, or any value within a range defined by any of the above values) to prevent impact on current control ability of the gate lines 104 caused by line-end shorting due to process variation. According to an embodiment of the present invention, the line ends of the dummy gate lines 106 is away from the boundary lines BN by a distance S. It is also important that the distance D1, the distance S, and the length L1 have the relationship: L1≤D1−S. The distance D1', the distance S, and the length L1' have the relationship: L1'≤D1'−S.

By the relationships as illustrated above, the integrated circuit layout 10 provided by the present invention may meet the requirements of manufacturability. More specifically, as the design rule of the standard cells of the integrated circuit layout 10 has become more and more critical for a higher device density, a gate line cut process may be used to manufacture the gate lines 104 and/or the dummy gate lines 106 on a substrate. A gate line cut process includes forming cut windows in an etching mask (such as a photoresist layer) to expose pre-determined portions of a continuous gate line (or dummy gate line) pattern and etching away the exposed pre-determined portions to cut the continuous gate line pattern into segmented patterns. By the relationships as illustrated above, the line ends of the gate lines 104 of the standard cell Cell-A would not overlap the cut window for segmenting continuous dummy gate lines into the dummy gate lines 106, so that the gate line cut process does not cut any portion of the line ends of the gate lines 104. Accordingly, sufficient end-cap lengths (the length L1 and the length L1') of the gate lines 104 may be ensured for better control of channel current.

FIG. 2 exemplarily shows an embodiment where the length L1 and the length L1' of the line ends (end-caps) of the gate lines 104 are respectively the maximum lengths allowed by the relationships as illustrated above. That is, FIG. 2 shows an embodiment where L1=D1−S1 and L1'=D1'−S. The distance S1 and the distance S1' are the same as the distance S. The gate lines 104 and the dummy gate lines 106 have a same gate line length. The line ends of the gate lines 104 and the dummy gate lines 106 are aligned with each other along the first direction X and are flush with an edge of the cut window CW for the gate line cut process (only the cut window CW between the standard cells Cell-A are shown for the sake of simplicity). The width of the cut window CW on the second direction Y is equal to the distance between the line ends of the adjacent dummy gate lines 106 along the second direction Y, that is, two times of the distance S. In other embodiments, when at least one of the relationships L1<D1−S and L1'<D1'−S are met, at least one of the distance S1 and the distance S1' would be larger than the distance S, and the gate lines 104 may have a gate line length smaller than a dummy gate line length of the dummy gate lines 106. According to an embodiment of the present invention, the distance D1 is equal to the distance D1', the length L1 is equal to the length L1', and the distance S1 is equal to the distance S1'.

In the embodiment shown in FIG. 2, the standard cells Cell-A in the upper side and lower side of FIG. 2 have a same number of gate lines 104, and the gate lines 104 of the standard cells Cell-A are aligned along the second direction Y. The dummy gate lines 106 of the standard cells Cell-A are also aligned along the second direction Y. The width (gate line width) of the gate lines 104 and the width (dummy gate line width) of the dummy gate lines 106 may be the same or different.

Figure 3:
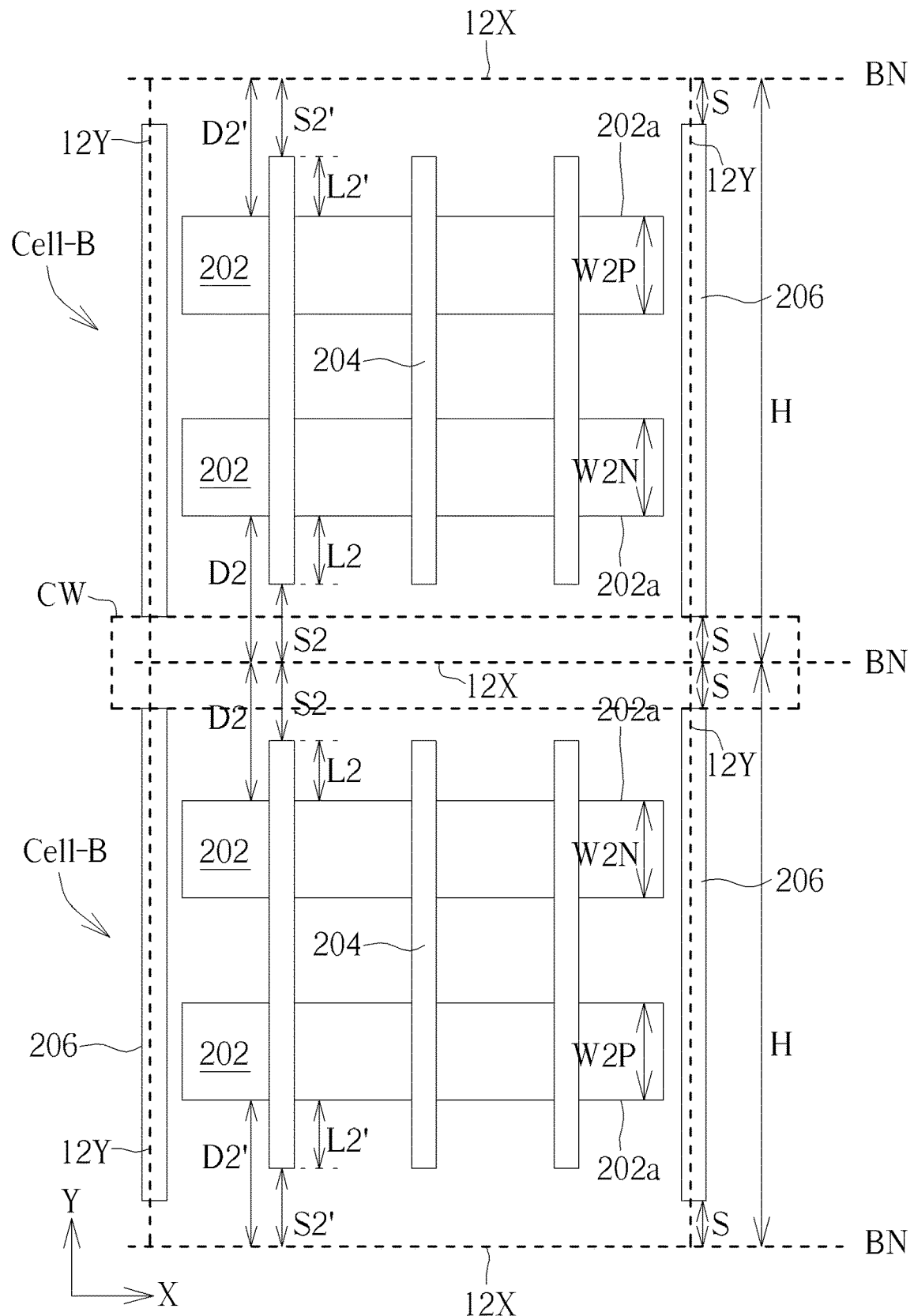
FIG. 3 is a partial enlarged plan view of an integrated circuit layout according to an embodiment of the present invention.

Please refer to FIG. 3, which is a partial enlarged plan view of an integrated circuit layout 10 according to an embodiment of the present invention. The integrated circuit layout 10 includes two standard cells Cell-B respectively disposed in two adjacent rows (such as the N row and the N+1 row as shown in FIG. 1) and abutting along a boundary line BN. The left side and right side of the standard cell Cell-B along the first direction X may abut to other standard cells of the same row. The upper side or lower side of the standard cell Cell-B along the second direction Y may abut to another standard cell of another adjacent row. To simplify the drawing, other standard cells are not shown in FIG. 3. The standard cell Cell-B includes two cell boundaries 12X that extend along the first direction X and two cell boundaries 12Y that extend along the second direction Y. The cell boundaries 12X overlap the boundary lines BN. The cell boundaries 12Y extend between the boundary lines BN. The standard cell Cell-B has a cell height H. According to an embodiment, the standard cell Cell-B is a low power cell.

The standard cell Cell-B includes two active regions 202 arranged along the second direction Y. The active regions 202 of the standard cell Cell-B respectively include an edge 202a that is adjacent to the boundary line BN and extends along the first direction X. The edges 202a of the active regions 202 are away from the boundary lines BN by a distance D2 and a distance D2', respectively.

According to an embodiment of the present invention, the two active regions 202 of the same standard cell Cell-B may have opposite conductivity types, and the active regions 202 at two sides of the boundary line BN and belonging to different standard cells Cell-B may have a same conductivity type. For example, in some embodiments, the two active regions 202 at two sides of the boundary line BN in the middle portion of FIG. 3 may have an n-type conductivity type, and the other two active regions 202 adjacent to the boundary lines BN in the upper portion and lower portion of FIG. 3 may have a p-type conductivity type. In other embodiments, the two active regions 202 at two sides of the boundary line BN in the middle portion of FIG. 3 may have a p-type conductivity type, and the other two active regions 202 adjacent to the boundary lines BN in the upper portion and lower portion of FIG. 3 may have an n-type conductivity type.

The active regions 202 of the standard cell Cell-B may respectively have an active region width W2N and an active region width W2P. The active region width W2N and an active region width W2P may be the same or different according to design needs to obtain desired electrical performance. In some embodiments, the active region width W2N and the active region width W2P may be the same. In other embodiments, the active region width W2N and the active region width W2P are different. The distance D2 and the distance D2' may be adjusted according to the active region width W2N and the active region width W2P, and may be the same or different.

As shown in FIG. 3, each standard cell Cell-B includes a plurality of gate lines 204 that are arranged in parallel and equally spaced (away from each other by a gate line pitch) along the first direction X and extend along the second direction Y to cross the active regions 202 of the standard cell Cell-B. The standard cell Cell-B also includes two dummy gate lines 206 disposed at two sides of the active regions 202. The dummy gate lines 206 extend along the second direction Y and are parallel to the gate lines 204. According to an embodiment of the present invention, the dummy gate lines 206 may be away from the gate lines 204 by the gate line pitch of the gate lines 204. The overlapping regions of the active regions 202 and the gate lines 204 are the channel regions of the transistors of the standard cell Cell-B. The currents of the channel regions and the ON or OFF states of the transistors are controlled by the gate lines 204. It is noteworthy that the line ends (end-caps) of the gate lines 204 of the standard cell Cell-B respectively protrude from the edges 202a of the active regions 102 by a length L2 and a length L2' and are away from the boundary lines BN by a distance S2 and a distance S2'. The distance S2, the distance D2 and the length L2 have the relationship: S2=D2−L2. The distance S2', the distance D2' and the length L2' have the relationship: S2'=D2'−L2'. The length L1 and the length L1' may be referred to as end-cap lengths of the gate lines 104. It is important that the length L2 and the length L2' are larger than a minimum design rule of the integrated circuit layout 10 (for example, 25 nm, 30 nm, 35 nm, 40 nm, 45 nm, 50 nm, or any value within a range defined by any of the above values) to prevent impact on current control ability of the gate lines 204 caused by line-end shorting due to process variation. According to an embodiment of the present invention, the line ends of the dummy gate lines 206 is away from the boundary lines BN by a distance S. It is also important that the distance D2, the distance S, and the length L2 have the relationship: L2<D2−S. The distance D2', the distance S, and the length L2' have the relationship: L2'<D2'−S.

By the relationships as illustrated above, when the design rule of the standard cells of the integrated circuit layout 10 has become more and more critical and a gate line cut process is used to manufacture the gate lines 204 and/or the dummy gate lines 206 on a substrate, the line ends of the gate lines 204 of the standard cell Cell-B would not overlap the cut window and would not be etched or cut during the gate line cut process. Therefore, it is ensured that the gate lines 204 manufactured on the substrate have desired gate line lengths and the end-cap lengths of the gate lines 204 (the length L2 and the length L2') are sufficient for better control of channel current. The integrated circuit layout 10 of the present invention may meet the requirements of manufacturability.

FIG. 3 exemplarily shows an embodiment where L2<D2−S and L2'<D2'−S. The distance S2 and the distance S2' are larger than the distance S. The gate line length of the gate lines 204 is larger than the dummy gate line length of the dummy gate lines 206. The line ends of the gate lines 204 are away from the edge of the cut window CW by a distance and are not flush with the edge of the cut window CW. According to an embodiment of the present invention, the distance D2 is equal to the distance D2', the length L2 is equal to the length L2', and the distance S2 is equal to the distance S2'.

Figure 4:
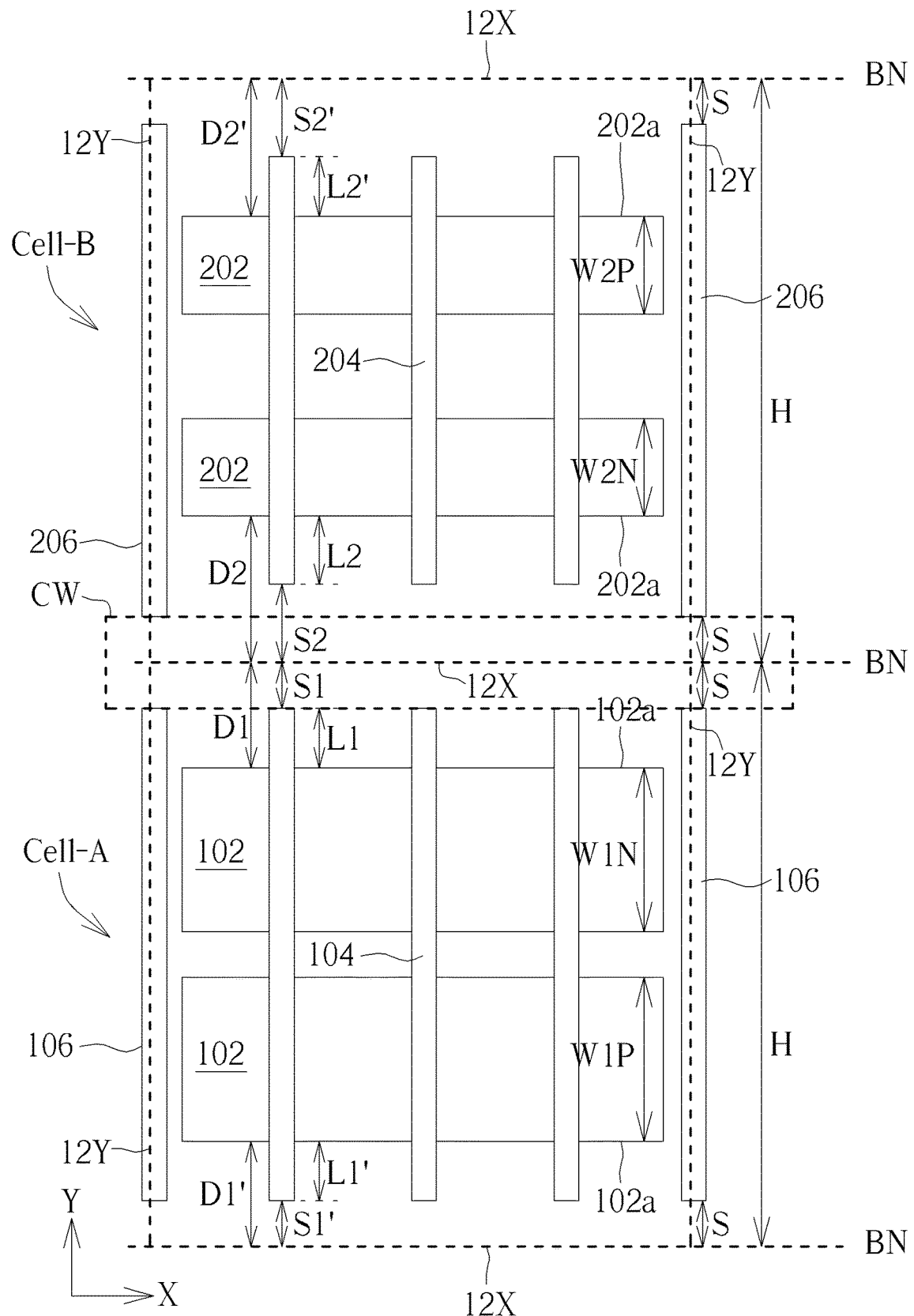
FIG. 4 is a partial enlarged plan view of an integrated circuit layout according to an embodiment of the present invention.

Please refer to FIG. 4, which is a partial enlarged plan view of an integrated circuit layout 10 according to an embodiment of the present invention. The integrated circuit layout 10 includes a standard cells Cell-A and a standard cell Cell-B respectively disposed in two adjacent rows (such as the N row and the N+1 row as shown in FIG. 1) and abutting along a boundary line BN. The left side and right side of the standard cell Cell-A and the standard cell Cell-B along the first direction X may abut to other standard cells of the same row. The upper side or lower side of the standard cell Cell-A and the standard cell Cell-B along the second direction Y may abut to another standard cell of another adjacent row. To simplify the drawing, other standard cells are not shown in FIG. 4. The standard cell Cell-A and the standard cell Cell-B respectively include two cell boundaries 12X that extend along the first direction X and two cell boundaries 12Y that extend along the second direction Y. The cell boundaries 12X overlap the boundary lines BN. The cell boundaries 12Y extend between the boundary lines BN. The standard cell Cell-A and the standard cell Cell-B are standard cells for different powers but have a same cell height H. According to an embodiment of the present invention, the standard cell Cell-A is a high performance cell, and the standard cell Cell-B is a low power cell.

Detailed descriptions about the active regions 102, 202, gate lines 104, 204, dummy gate lines 106, 206, distance D1, distance D1', distance D2, distance D2', distance S, distance S1, distance S1', distance S2, distance S2' and the conductivity type of the active regions 102, 202 of the standard cell Cell-A and the standard cell Cell-B may be referred to the descriptions of FIG. 2 and FIG. 3, and would not be repeated herein for brevity. This embodiment is to show the features that, the active region 102 of the standard cell Cell-A and the active region 202 of the standard cell Cell-B at two sides of the boundary line BN in the middle portion of FIG. 4 have a same conductivity type (such as an n-type conductivity type) and respectively have an active region width W1N and an active region width W2N, wherein the active region width W1N is larger than the active region width W2N. The other active region 102 of the standard cell Cell-A adjacent to the boundary line BN in the lower portion of FIG. 4 and the other active region 202 of the standard cell Cell-B adjacent to the boundary line BN in the upper portion of FIG. 4 have a same conductivity type (such as a p-type conductivity type) and respectively have an active region width W1P and an active region width W2P, wherein the active region width W1P is larger than the active region width W2P.

The gate lines 104 of the standard cell Cell-A and the gate lines 204 of the standard cell Cell-B may have a same gate line width or different gate line widths. The gate lines 104 and the gate lines 204 may be arranged in a same gate line pitch along the first direction X, so that the gate lines 104 and the gate lines 204 are aligned along the second direction Y. The dummy gate lines 106 of the standard cell Cell-A and the dummy gate lines 206 of the standard cell Cell-B may have a same dummy gate line width and a same dummy gate line length, and are aligned along the second direction Y. It is noteworthy that in this embodiment, the distance D1 and the distance D2 between the boundary line BN (such as the boundary line BN in the middle portion of FIG. 4) and the edge 102a of the active region 102 of the standard cell Cell-A and the edge 202a of the active region 202 of the standard cell Cell-B at two sides of the boundary line BN are different. Furthermore, the distance D1, the distance D2, the distance S, the length L1, the length L2 have the relationships:

$L1 \leq D1-S;$ $L2 \leq D2-S;$ and $D1 \neq D2.$

By the relationships as illustrated above, the gate lines 104 and the dummy gate lines 106 of the standard cell Cell-A and the gate lines 204 and dummy gate lines 206 of the standard cell Cell-B may be manufactured on a substrate by a gate line cut process without the risk of cutting any necessary portion of the line ends of the gate lines 104, 204. It is ensured that the gate lines 104, 204 manufactured on the substrate have desired gate line lengths, and the end-cap lengths of the gate lines 104 (the length L1 and the length L1') and the end-cap lengths of the gate lines 204 (the length L2 and the length L2') are sufficient for better control of channel current. The integrated circuit layout 10 of the present invention may meet the requirements of manufacturability.

FIG. 4 exemplarily shows an embodiment where D1<D2, L1=D1-S, and L2<D2-S. The line ends of the gate lines 104 are flush with the edge of the cut window CW. The line ends of the gate lines 204 are away from the edge of the cut window CW by a distance. The line ends of the dummy gate lines 106 and 206 are flush with the edge of the cut window CW. The length L2 may be equal to or larger than the length L1. When the distance D1' the length L1' of the standard cell Cell-A and the distance S have the relationship: L1'=D1'-S, the gate lines 104 and the dummy gate lines 106 may have a same gate line length. The gate line length of the gate line 204 of the standard cell Cell-B is smaller than the dummy gate line length of the dummy gate lines 206.

Figure 5:
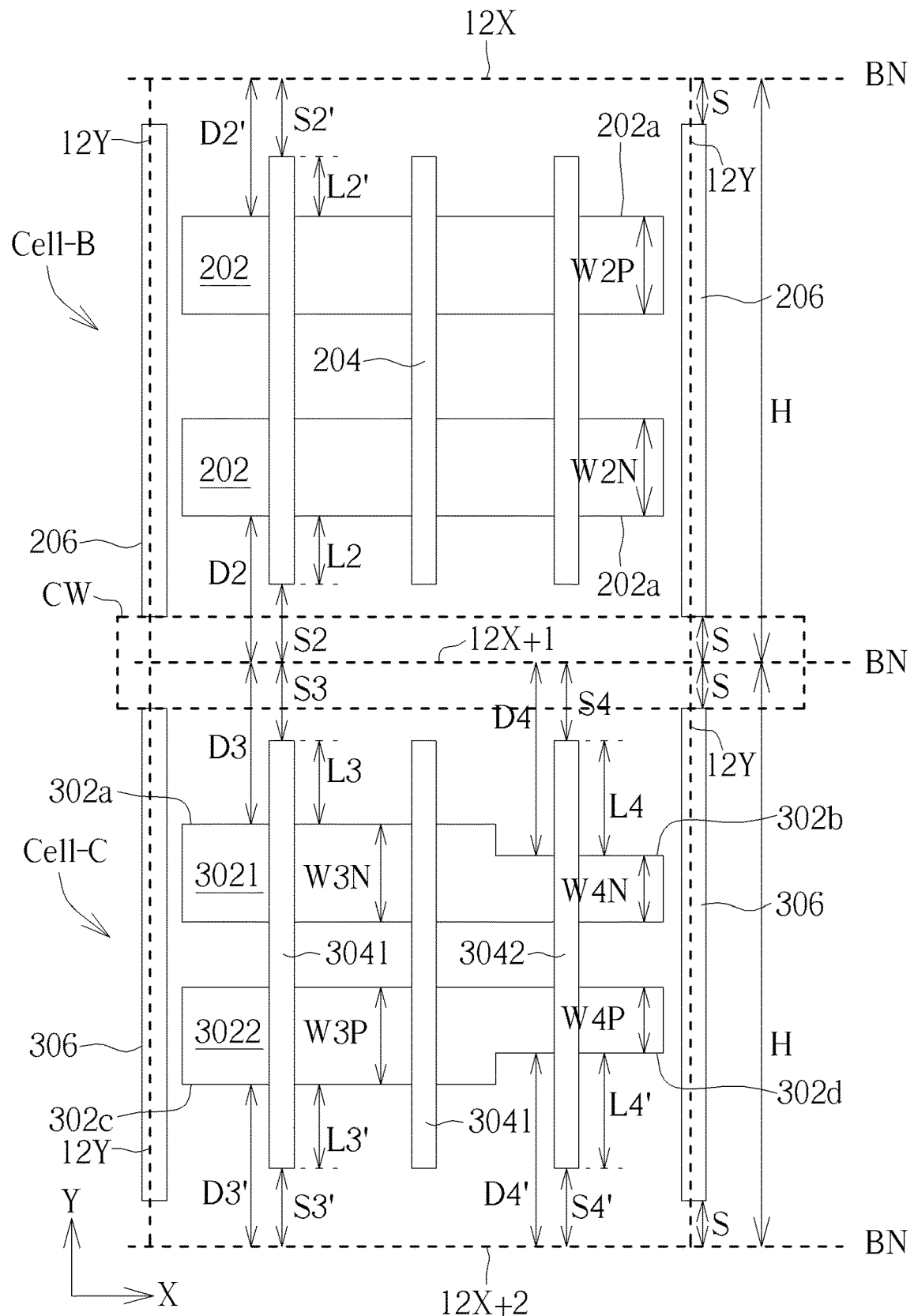
FIG. 5 is a partial enlarged plan view of an integrated circuit layout according to an embodiment of the present invention.

Please refer to FIG. 5, which is a partial enlarged plan view of an integrated circuit layout 10 according to an embodiment of the present invention. The integrated circuit layout 10 includes a standard cell Cell-B and a standard cell Cell-C respectively disposed in two adjacent rows (such as the N row and the N+1 row as shown in FIG. 1) and abutting along a boundary line BN. The left side and right side of the standard cell Cell-B and the standard cell Cell-C along the first direction X may abut to other standard cells of the same row. The upper side or lower side of the standard cell Cell-B and the standard cell Cell-C along the second direction Y may abut to another standard cell of another adjacent row. To simplify the drawing, other standard cells are not shown in FIG. 5. The standard cell Cell-B and the standard cell Cell-C respectively include two cell boundaries 12X that extend along the first direction X and two cell boundaries 12Y that extend along the second direction Y. The cell boundaries 12X overlap the boundary lines BN. The cell boundaries 12Y extend between the boundary lines BN. The standard cell Cell-B and the standard cell Cell-C are different types of low power cells that have a same cell height H.

Detailed descriptions about the active regions 202, gate lines 204, dummy gate lines 206, distance D2, distance D2', distance S, distance S2, distance S2' and the conductivity type of the active regions 202 of the standard cell Cell-B may be referred to the descriptions of FIG. 3, and would not be repeated herein for brevity. The following description will focus on the standard cell Cell-C. For the clarity of explanation, some features of the standard cell Cell-C are defined as following: the cell boundary 12X of the standard cell Cell-C overlapping the boundary line BN in the middle portion of FIG. 5 is referred to as the upper cell boundary 12X+1; the cell boundary 12X of the standard cell Cell-C overlapping the boundary line BN in the lower portion of FIG. 5 is referred to as the lower cell boundary 12X+2; the active region 302 adjacent to the upper cell boundary 12X+1 is referred to as the upper active region 3021; and the active region 302 adjacent to the lower cell boundary 12X+2 is referred to as the lower active region 3022.

According to an embodiment of the present invention, the upper active region 3021 of the standard cell Cell-C and the active region 302 of the standard cell Cell-B adjacent to the upper cell boundary 12X+1 have a same conductivity type, such as an n-type conductivity type, and the lower active region 3022 of the standard cell Cell-C have a conductivity type opposite to the conductivity type of the upper active region 3021, such as a p-type conductivity type. According to another embodiment of the present invention, the upper active region 3021 of the standard cell Cell-C and the active region 302 of the standard cell Cell-B adjacent to the upper cell boundary 12X+1 may have a p-type conductivity type, and the lower active region 3022 of the standard cell Cell-C may have an n-type conductivity type. The upper active region 3021 and the lower active region 3022 respectively have a wider portion and a narrower portion having different active region widths. For example, as shown in FIG. 5, the upper active region 3021 has a wider portion having an active region width W3N and a narrower portion having an active region width W4N, wherein the active region width W3N is larger than the active region width W4N. The lower active region 3022 has a wider portion having an active region width W3P and a narrower portion having an active region width W4P, wherein the active region width W3P is larger than the active region width W4P. The edges of the wider portion and the narrower portion of the upper active region 3021 and the lower active region 3022 are away from the adjacent boundary lines BN by different distances to produce a step profile.

The wider portion of the upper active region 3021 includes a first edge 302a that extends along the first direction X and is away from the upper cell boundary 12X+1 by a distance D3. The narrower portion of the upper active region 3021 includes a second edge 302b that extends along the first direction X and is away from the upper cell boundary 12X+1 by a distance D4. The wider portion of the lower active region 3022 includes a third edge 302c that extends along the first direction X and is away from the lower cell boundary 12X+2 by a distance D3'. The narrower portion of the lower active region 3022 includes a fourth edge 302d that extends along the first direction X and is away from the lower cell boundary 12X+2 by a distance D4'. The distance D3 is different from the distance D4 (D3≠D4). The distance D3' is different from the distance D4' (D3'≠D4'). FIG. 5 exemplarily shows an embodiment where the distance D3 is smaller than the distance D4 (D3<D4) and the distance D3' is smaller than the distance D4' (D3'<D4').

The standard cell Cell-C includes a plurality of gate lines that are arranged in parallel and equally spaced (away from each other by a gate line pitch) along the first direction X, wherein the gate lines includes a gate line 3041 that extends along the second direction Y to cross the wider portions of the upper active region 3021 and the lower active region 3022 and a gate line 3042 that extends along the second direction Y to cross the narrower portions of the upper active region 3021 and the lower active region 3022. The line ends (end-caps) of the gate line 3041 respectively protrude from the first edge 302a and the third edge 302c by a distance L3 and a distance L3' and are away from the boundary lines BN (away from the upper cell boundary 12X+1 and the lower cell boundary 12X+2) by distance S3 and a distance S3', wherein S3=D3−L3, and S3'=D3'−L3'. The line ends (end-caps) of the gate line 3042 respectively protrude from the second edge 302b and the fourth edge 302d by a distance L4 and a distance L4' and are away from the boundary lines BN (away from the upper cell boundary 12X+1 and the lower cell boundary 12X+2) by a distance S4 and a distance S4', wherein S4=D4−L4, and S4'=D4'−L4'. The length L4 may be equal to or larger than the length L3. The length L4' may be equal to or larger than the length L3'. The overlapping regions of the upper active region 3021, the lower active region 3022 and the gate line 3041 and the gate line 3042 are channel regions of the transistors of the standard cell Cell-C. It is important that the length L3, the length L3', the length L4 and the length L4' are larger than a minimum design rule of the integrated circuit layout 10 (for example, 25 nm, 30 nm, 35 nm, 40 nm, 45 nm, 50 nm, or any value within a range defined by any of the above values) to prevent impact on current control ability of the gate line 3041 and the gate line 3042 caused by line-end shorting due to process variation.

The standard cell Cell-C also includes two dummy gate lines 306 disposed at two sides of the upper active region 3021 and the lower active region 3022. The dummy gate lines 306 extend along the second direction Y and are parallel to the gate line 3041 and the gate line 3042. According to an embodiment of the present invention, the dummy gate lines 306 may be away from the gate lines by the gate line pitch of the standard cell Cell-C. The line ends of the dummy gate lines 306 are away from the boundary lines BN (away from the upper cell boundary 12X+1 and the lower cell boundary 12X+2) by a distance S. It is also important that the distance D3, the distance D4, the distance S, the length L3 and the length L4 have the relationships:

$$L3 \leq D3 - S;$$

$$L4 \leq D4 - S; \text{ and}$$

$$D3 \neq D4.$$

The distance D3', the distance D4', the distance S, the length L3' and the length L4' have the relationships:

$$L3' \leq D3' - S;$$

$$L4' \leq D4' - S; \text{ and}$$

$$D3' \neq D4'.$$

By the relationships as illustrated above, the gate lines 3041, 3042 and the dummy gate lines 306 of the standard cell Cell-C may be manufactured on a substrate by a gate line cut process without the risk of cutting any necessary portion of the line ends of the gate lines 3041, 3042. It is ensured that the gate lines 3041, 3042 manufactured on the substrate have desired gate line lengths, and the end-cap lengths of the gate line 3041 (the length L3 and the length L3') and the end-cap lengths of the gate line 3042 (the length L4 and the length L4') are sufficient for better control of channel current. The integrated circuit layout 10 of the present invention may meet the requirements of manufacturability.

FIG. 5 exemplarily shows an embodiment where D3<D4, L3<D3−S, L4<D4−S, and L3<L4. The distance S3 and the distance S4 are larger than the distance S. The gate line lengths of the gate lines 3041, 3042 are smaller than the dummy gate line length of the dummy gate line 306. The line ends of the dummy gate lines 304 are flush with the edge of the cut window CW. The line ends of the gate lines 3041, 3042 are away from the edge of the cut window CW and are not flush with the edge of the cut window CW. In some embodiments, the distance S3 and the distance S4 are equal, the distance S3' and the distance S4' are equal, and the line ends of the gate lines 3041, 3042 are aligned along the first direction X. In some embodiments, the distance D3', the distance D4', the length L3', the length L4', the distance S3' and the distance S4' are equal to the distance D3, the distance D4, the length L3, the length L4, the distance S3 and the distance S4, respectively.

The gate line width of the gate lines 3041, 3042 of the standard cell Cell-C and the gate line width of the gate lines 204 of the standard cell Cell-B may be the same or different. In some embodiments, the gate lines 3041, 3042 of the standard cell Cell-C and the gate lines 204 of the standard cell Cell-B have a same gate line width.

Figure 6:
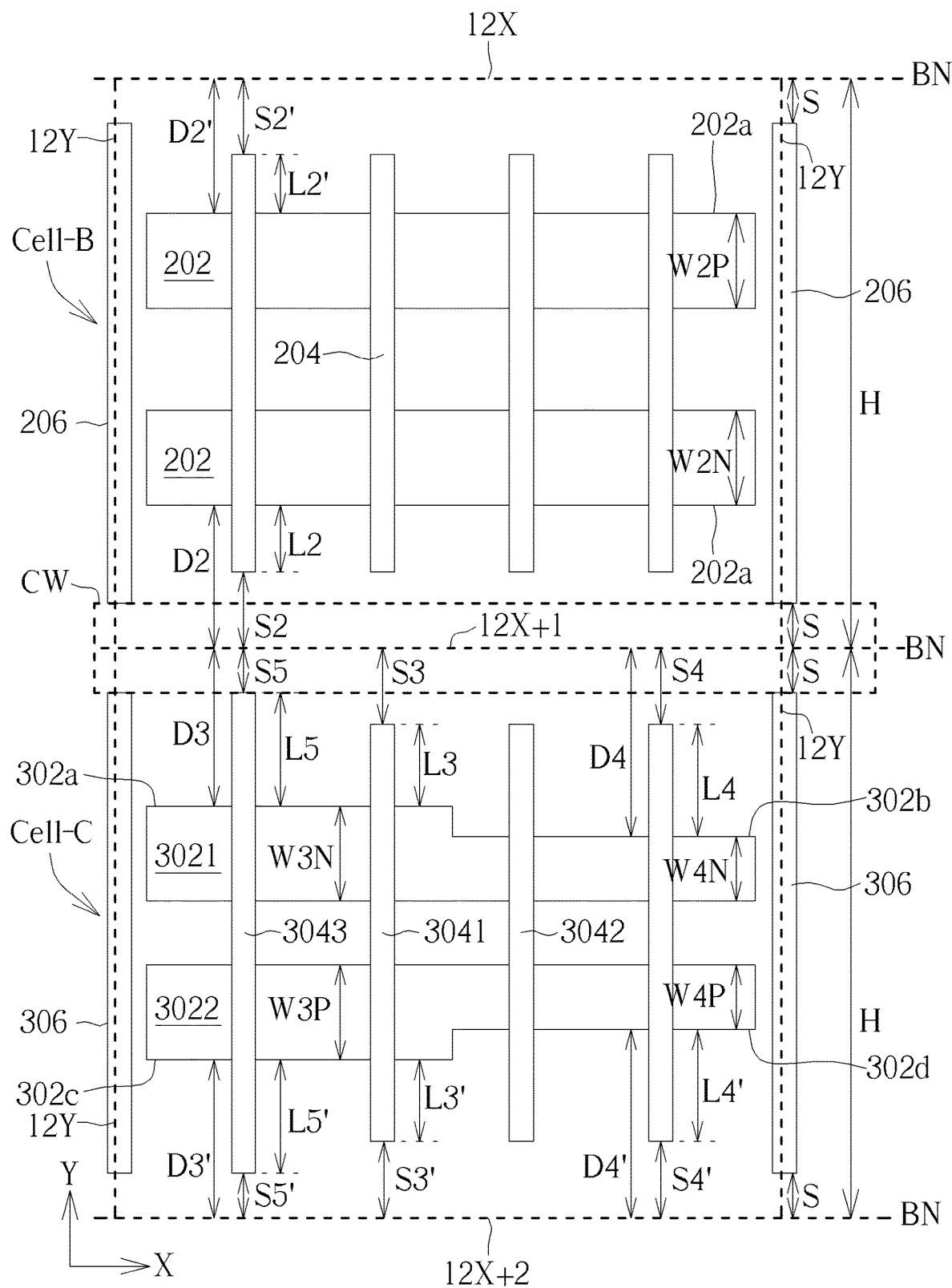
FIG. 6 is a partial enlarged plan view of an integrated circuit layout according to an embodiment of the present invention.

Please refer to FIG. 6, which is a partial enlarged plan view of an integrated circuit layout 10 according to an embodiment of the present invention. The integrated circuit layout 10 includes a standard cell Cell-B and a standard cell Cell-C respectively disposed in two adjacent rows (such as the N row and the N+1 row as shown in FIG. 1) and abutting along a boundary line BN. The left side and right side of the standard cell Cell-B and the standard cell Cell-C along the first direction X may abut to other standard cells of the same row. The upper side or lower side of the standard cell Cell-B and the standard cell Cell-C along the second direction Y may abut to another standard cell of another adjacent row. To simplify the drawing, other standard cells are not shown in FIG. 6. The standard cell Cell-B and the standard cell Cell-C respectively include two cell boundaries 12X that extend along the first direction X and two cell boundaries 12Y that extend along the second direction Y. The cell boundaries 12X overlap the boundary lines BN. The cell boundaries 12Y extend between the boundary lines BN. The standard cell Cell-B and the standard cell Cell-C are different types of low power cells that have a same cell height H.

Detailed descriptions about the active regions, gate lines, dummy gate lines, and the conductivity types of the active regions of the standard cell Cell-B and the standard cell Cell-C may be referred to the descriptions of FIG. 3 and FIG. 5, and would not be repeated herein for brevity. This embodiment is to show the features that, the standard cell Cell-C further includes a gate line 3043 that extends along the second direction Y to cross the wider portions of the upper active region 3021 and the lower active region 3022. The line ends of the gate line 3043 respectively protrude from the first edge 302a and the third edge 302c by a distance L5 and a distance L5' and are away from the boundary lines BN (away from the upper cell boundary 12X+1 and the lower cell boundary 12X+2) by distance S5 and a distance S5', wherein S5=D3−L5, and S5'=D3'−L5'. It is important that the length L5 and the length L5' are larger than a minimum design rule of the integrated circuit layout 10 (for example, 25 nm, 30 nm, 35 nm, 40 nm, 45 nm, 50 nm, or any value within a range defined by any of the above values) to prevent impact on current control ability of the gate line 3043 caused by line-end shorting due to process variation. It is also important that the distance D3, the distance S, the length L5 have the relationship: L5≤D3−S, and the distance D3', the distance S, the length L5' have the relationship: L5'≤D3'−S, wherein the distance S is the distance between the line ends of the dummy gate lines 306 and the boundary lines BN.

By the relationships as illustrated above, the gate lines 3041, 3042, and 3043 and the dummy gate lines 306 of the standard cell Cell-C may be manufactured on a substrate by a gate line cut process without the risk of cutting any necessary portion of the line ends of the gate lines 3041, 3042, and 3043. It is ensured that the gate lines 3041, 3042, and 3043 manufactured on the substrate have desired gate line lengths, and the end-cap lengths of the gate line 3041 (the length L3 and the length L3'), the end-cap lengths of the gate line 3042 (the length L4 and the length L4') and the end-cap lengths of the gate line 3043 (the length L5 and the length L5') are sufficient for better control of channel current. The integrated circuit layout 10 of the present invention may meet the requirements of manufacturability.

FIG. 6 exemplarily shows an embodiment where L5>L3, L5=D3−S, and S5=S. The line end of the gate line 3043 having the end-cap length L5 is flush with the edge of the cut window CW while the line end of the gate line 3041 having the end-cap length L3 is away from the edge of the cut window CW and is not flush with the edge of the cut window CW. The gate line length of the gate line 3043 is larger than the gate lines 3041 and 3042. When L5'=D3'−S, and S5'=S, the gate line length of the gate line 3043 is the same as the dummy gate line length of the dummy gate line 306.

Figure 7:
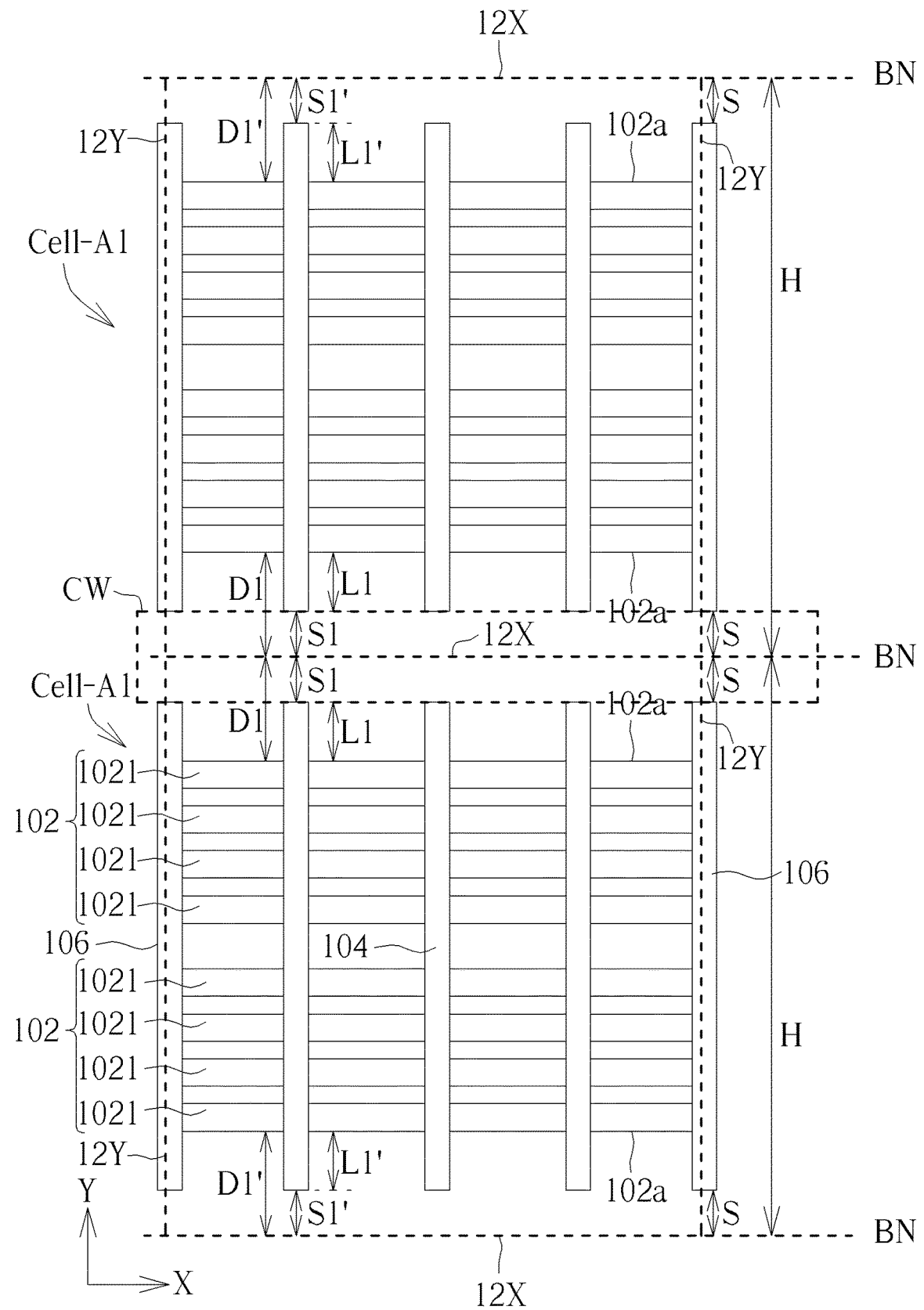
FIG. 7 is a partial enlarged plan view of an integrated circuit layout according to an embodiment of the present invention.

Please refer to FIG. 7, which is a partial enlarged plan view of an integrated circuit layout 10 according to an embodiment of the present invention. The integrated circuit layout 10 includes two standard cells Cell-A1 respectively disposed in two adjacent rows (such as the N row and the N+1 row as shown in FIG. 1) and abutting along a boundary line BN. The left side and right side of the standard cell Cell-A1 along the first direction X may abut to other standard cells of the same row. The upper side or lower side of the standard cell Cell-A1 along the second direction Y may abut to another standard cell of another adjacent row. To simplify the drawing, other standard cells are not shown in FIG. 7. The standard cell Cell-A1 includes two cell boundaries 12X that extend along the first direction X and two cell boundaries 12Y that extend along the second direction Y. The cell boundaries 12X overlap the boundary lines BN. The cell boundaries 12Y extend between the boundary lines BN. The standard cell Cell-A1 has a cell height H. According to an embodiment, the standard cell Cell-A1 is a high performance cell.

Detailed descriptions about the gate lines 104, the dummy gate lines 106 and the conductivity types of the active regions 102 may be referred to the descriptions about the standard cells Cell-A shown in FIG. 2, and would not be repeated herein for brevity. A main difference between the standard cell Cell-A1 and the standard cell Cell-A is the design of the active region 102. The active regions 102 of the standard cells Cell-A1 respectively include a plurality of fin structures 1021 in a same size, such as four fin structures 1021. The fin structures 1021 extend along the first direction X and are arranged in parallel along the second direction Y. In some embodiments, the line ends of the fin structures 1021 are covered by the dummy gate lines 106 and are not exposed.

As shown in FIG. 7, the edges 102a of two of the fin structures 1021 that are most adjacent to the boundary line BN are away from the boundary line BN by a distance D1 and a distance D1', respectively. The line ends of the gate lines 104 respectively protrude from the edges 102a of the two fin structures 1021 by a length L1 and a length L1'. It is important that when the line ends of the dummy gate lines 106 are away from the boundary line BN by the distance S, the distance D1, the distance S, the length L1 have the relationship: L1≤D1−S, and the distance D1', the distance S, the length L1' have the relationship: L1'≤D1'−S.

Figure 8:
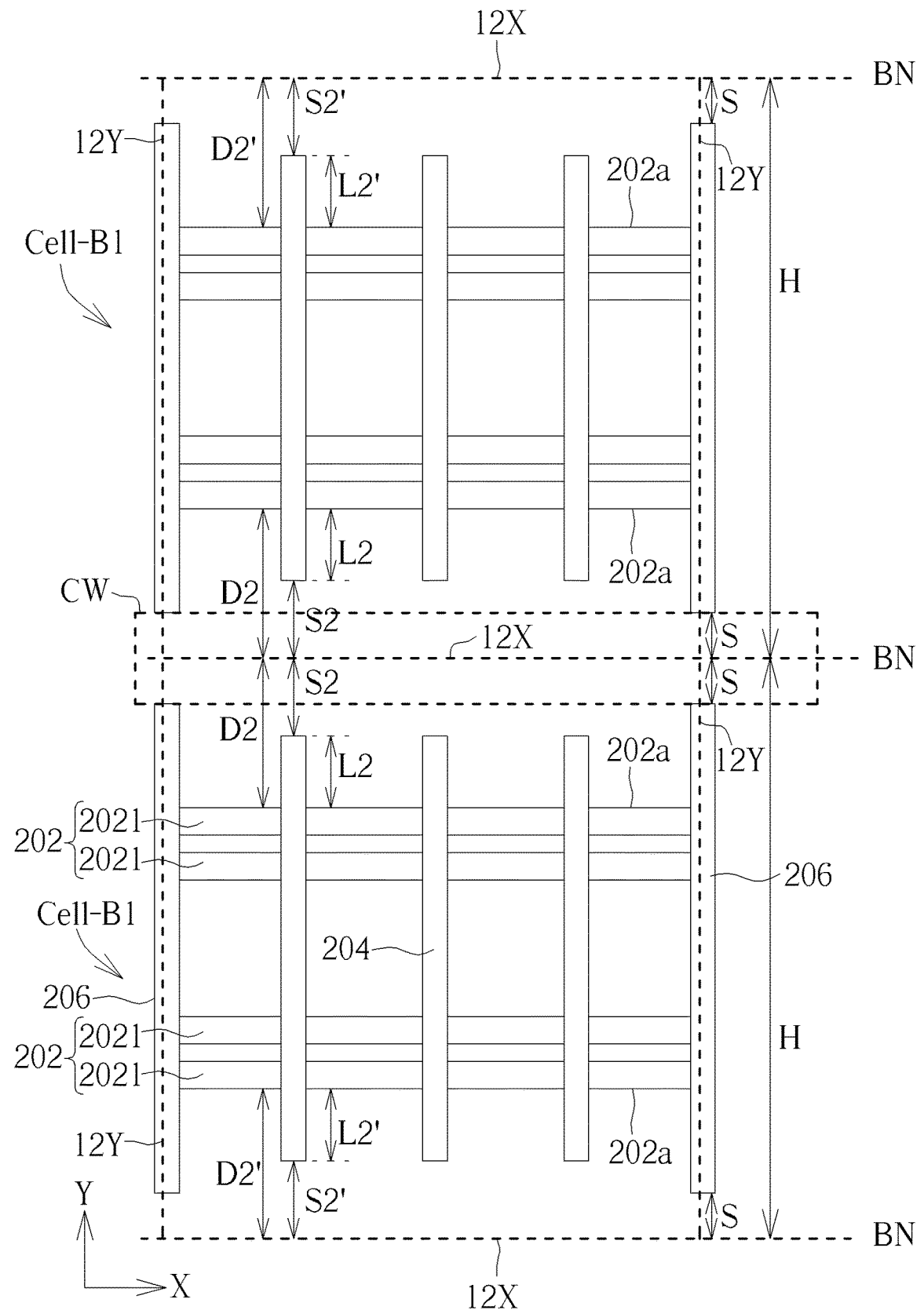
FIG. 8 is a partial enlarged plan view of an integrated circuit layout according to an embodiment of the present invention.

Please refer to FIG. 8, which is a partial enlarged plan view of an integrated circuit layout 10 according to an embodiment of the present invention. The integrated circuit layout 10 includes two standard cells Cell-B1 respectively disposed in two adjacent rows (such as the N row and the N+1 row as shown in FIG. 1) and abutting along a boundary line BN. The left side and right side of the standard cell Cell-B1 along the first direction X may abut to other standard cells of the same row. The upper side or lower side of the standard cell Cell-B1 along the second direction Y may abut to another standard cell of another adjacent row. To simplify the drawing, other standard cells are not shown in FIG. 8. The standard cell Cell-B1 includes two cell boundaries 12X that extend along the first direction X and two cell boundaries 12Y that extend along the second direction Y. The cell boundaries 12X overlap the boundary lines BN. The cell boundaries 12Y extend between the boundary lines BN. The standard cell Cell-B1 has a cell height H. According to an embodiment, the standard cell Cell-B1 is a low power cell.

Detailed descriptions about the gate lines 204, the dummy gate lines 206 and the conductivity types of the active regions 202 may be referred to the descriptions about the standard cells Cell-B shown in FIG. 3, and would not be repeated herein for brevity. The main difference between the standard cell Cell-B1 and the standard cell Cell-B is the design of the active region 202. The active regions 202 of the standard cells Cell-B1 respectively include a plurality of fin structures 2021 in a same size, such as four fin structures 2021. The fin structures 2021 extend along the first direction X and are arranged in parallel along the second direction Y.

In some embodiments, the line ends of the fin structures 2021 are covered by the dummy gate lines 206 and are not exposed.

As shown in FIG. 8, the edges 202a of two of the fin structures 2021 that are most adjacent to the boundary line BN are away from the boundary line BN by a distance D2 and a distance D2', respectively. The line ends of the gate lines 204 respectively protrude from the edges 202a of the two fin structures 2021 by a length L2 and a length L2'. It is important that when the line ends of the dummy gate lines 206 are away from the boundary line BN by the distance S, the distance D2, the distance S, the length L2 have the relationship: L2≤D2−S, and the distance D2', the distance S, the length L2' have the relationship: L2'≤D2'−S.

Figure 9:
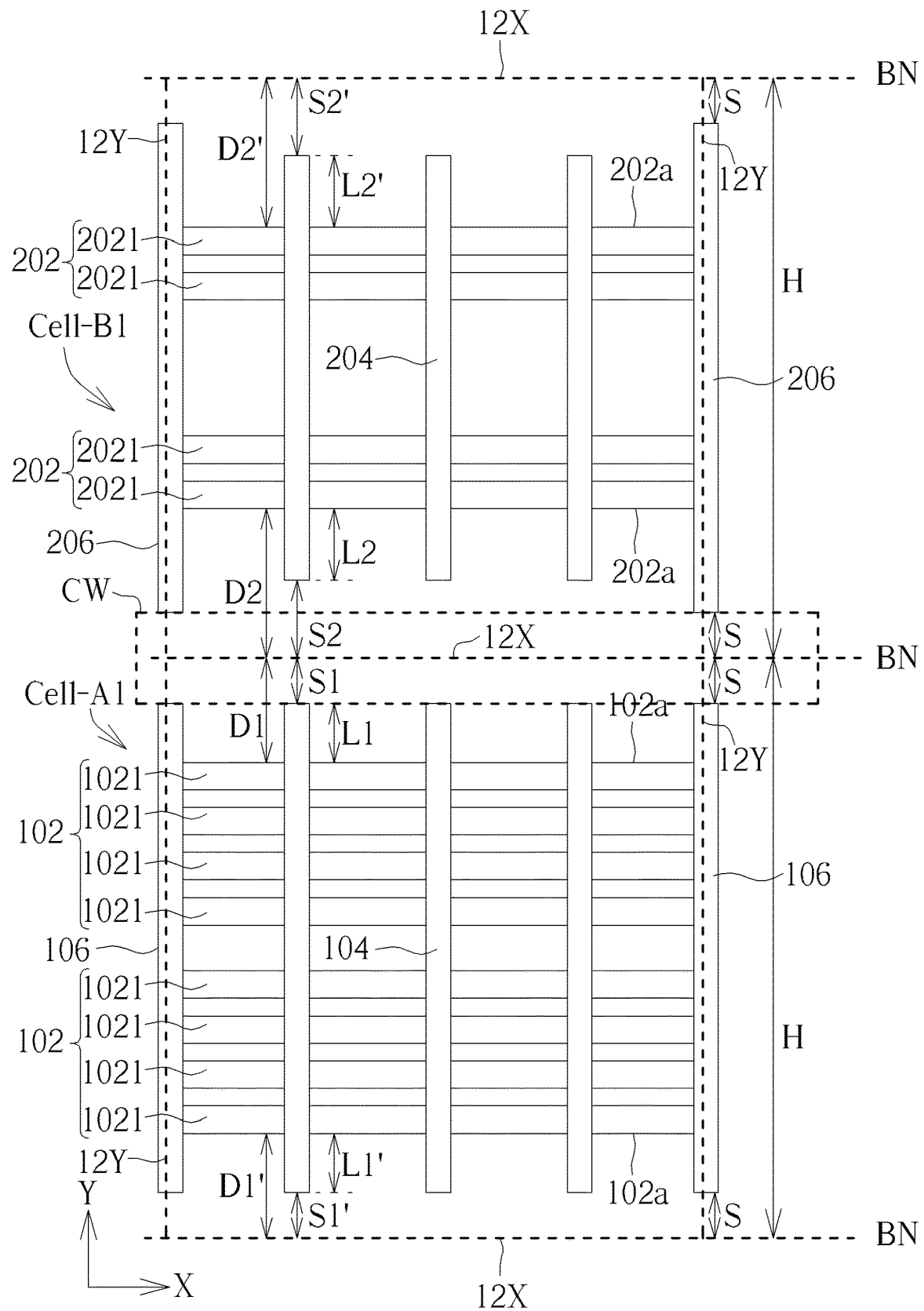
FIG. 9 is a partial enlarged plan view of an integrated circuit layout according to an embodiment of the present invention.

Please refer to FIG. 9, which is a partial enlarged plan view of an integrated circuit layout 10 according to an embodiment of the present invention. The integrated circuit layout 10 includes a standard cell Cell-A1 and a standard cell Cell-B1 respectively disposed in two adjacent rows (such as the N row and the N+1 row as shown in FIG. 1) and abutting along a boundary line BN. The left side and right side of the standard cell Cell-A1 and the standard cell Cell-B1 along the first direction X may abut to other standard cells of the same row. The upper side or lower side of the standard cell Cell-A1 and the standard cell Cell-B1 along the second direction Y may abut to another standard cell of another adjacent row. To simplify the drawing, other standard cells are not shown in FIG. 9. The standard cell Cell-A1 and the standard cell Cell-B1 respectively include two cell boundaries 12X that extend along the first direction X and two cell boundaries 12Y that extend along the second direction Y. The cell boundaries 12X overlap the boundary lines BN. The cell boundaries 12Y extend between the boundary lines BN. The standard cell Cell-A1 and the standard cell Cell-B1 are standard cells for different powers but have a same cell height H. According to an embodiment of the present invention, the standard cell Cell-A1 is a high performance cell, and the standard cell Cell-B1 is a low power cell.

Detailed descriptions about the gate lines 104, 204, dummy gate lines 106, 206, and the conductivity types of the active regions 102, 202 of the standard cell Cell-A1 and the standard cell Cell-B1 may be referred to the descriptions of FIG. 2, FIG. 3, FIG. 7 and FIG. 8, and would not be repeated herein for brevity. This embodiment is to show the features that, the numbers of the fin structures 1021 of the standard cell Cell-A1 and the fin structures 2021 of the standard cell Cell-B1 are different, and the distance D1 between the edge 102a of the fin structure 1021 of the standard cell Cell-A1 and the boundary line BN (the one between the standard cell Cell-A1 and the standard cell Cell-B1) is different from the D2 between the edge 202a of the fin structure 2021 of the standard cell Cell-B1 and the boundary line BN. Furthermore, the distance D1, the distance D2, the distance S, the length L1 and the length L2 have the relationship:

$L1 \leq D1 - S;$ $L2 \leq D2 - S;$ and $D1 \neq D2.$

Figure 10:
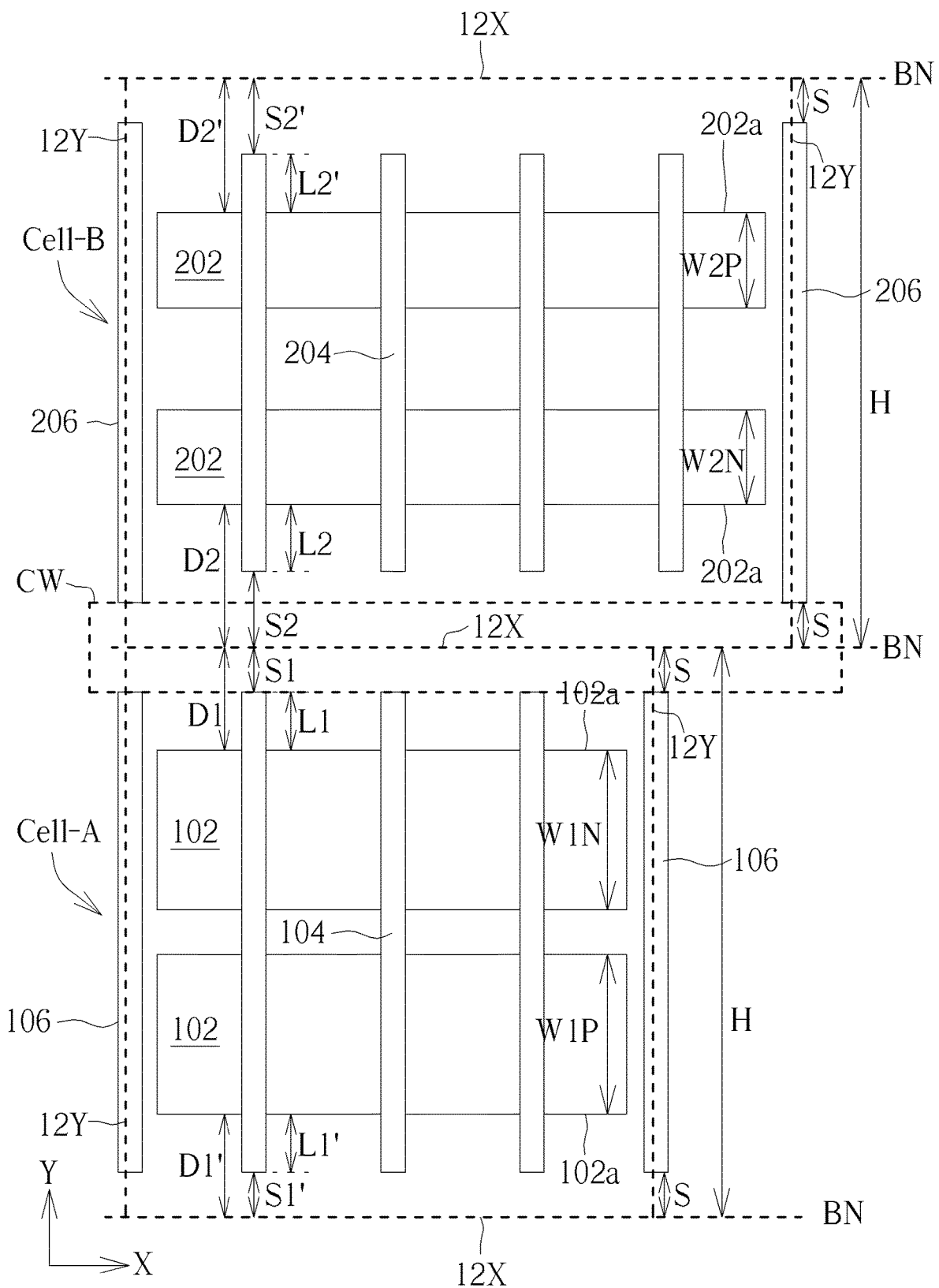
FIG. 10 is a partial enlarged plan view of an integrated circuit layout according to an embodiment of the present invention.

Please refer to FIG. 10, which is a partial enlarged plan view of an integrated circuit layout 10 according to an embodiment of the present invention. The integrated circuit layout 10 includes a standard cells Cell-A and a standard cell Cell-B respectively disposed in two adjacent rows (such as the N row and the N+1 row as shown in FIG. 1) and abutting along a boundary line BN. The left side and right side of the standard cell Cell-A and the standard cell Cell-B along the first direction X may abut to other standard cells of the same row. The upper side or lower side of the standard cell Cell-A and the standard cell Cell-B along the second direction Y may abut to another standard cell of another adjacent row. To simplify the drawing, other standard cells are not shown in FIG. 4. The standard cell Cell-A and the standard cell Cell-B respectively include two cell boundaries 12X that extend along the first direction X and two cell boundaries 12Y that extend along the second direction Y. The cell boundaries 12X overlap the boundary lines BN. The cell boundaries 12Y extend between the boundary lines BN. The standard cell Cell-A and the standard cell Cell-B are standard cells for different powers but have a same cell height H. According to an embodiment of the present invention, the standard cell Cell-A is a high performance cell, and the standard cell Cell-B is a low power cell.

Detailed descriptions about the gate lines 104, 204, the dummy gate lines 106, 206, the active regions 102, 202 and the conductivity types of the active regions 102, 202 may be referred to the descriptions of FIG. 4, and would not be repeated herein for brevity. This embodiment is to show the features that, the numbers of the gate lines 104 of the standard cell Cell-A and the gate lines 204 of the standard cell Cell-B are different, and are arranged along the first direction X by a same gate line pitch. The standard cell Cell-A and the standard cell Cell-B have different cell widths, but have a same cell height. For example, as shown in FIG. 10, the standard cell Cell-A has three gate lines 104, the standard cell Cell-B has four gate lines 204, and the cell width of the standard cell Cell-B is larger than the cell width of the standard cell Cell-A. At least a portion of the gate line 104 is aligned with a portion of the gate line 204 along the second direction Y. In some embodiments, one of the dummy gate lines 106 and one of the dummy gate lines 206 are aligned along the second direction Y, and the other dummy gate lines 106 is aligned with one of the gate lines 204 along the second direction Y. The numbers of the gate lines 104 and gate lines 204 are example and should not be taken as a limitation to the present invention. Other numbers of gate lines 104 and gate lines 204 are included in the scope of the present invention.

In summary, the standard cells for forming an integrated circuit layout provided by the present invention all have a same cell height, so they can be conveniently mix used in a same routing block of an integrated circuit layout no matter the standard cells have a same width or different cell widths. Furthermore, along a boundary line between the rows of the standard cells, the end-cap length L (the length by which the gate line protruding from the edge of the active region), the distance D between the edge of the active region and the boundary line, and the distance S between the line end of the dummy gate line and the boundary line have the relationship: L≤D−S. In this way, the gate lines and dummy gate lines of the integrated circuit layout may be manufactured on a substrate by a gate line cut process without the risk of cutting any necessary portion of the gate lines, and the end-cap lengths of the gate lines may be ensured. The integrated circuit layout provided by the present invention may meet the requirements of manufacturability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit layout, comprising:
a first row of standard cells and a second row of standard cells abutting along a boundary line extending along a first direction;
a first standard cell of the first row of standard cells, comprising:
a first active region having a first conductivity type and comprising an edge extending along the first direction and adjacent to the boundary line;
another first active region having a second conductivity type and at a side of the first active region that is opposite to the boundary line;
a first gate line extending along a second direction, crossing over the first active region and the another first active region, and protruding from the edge of the first active region by a length L1; and
two first dummy gate lines disposed at two sides of the first active region and parallel to the first gate line; and
a second standard cell of the second row of standard cells, comprising:
a second active region having the first conductivity type and comprising an edge extending along the first direction and adjacent to the boundary line;
another second active region having the second conductivity type and at a side of the second active region that is opposite to the boundary line;
a second gate line extending along the second direction, crossing over the second active region and the another second active region, and protruding from the edge of the second active region by a length L2; and
two second dummy gate lines disposed at two sides of the second active region and parallel to the second gate line,
wherein the first direction and the second direction are perpendicular with respect to one another, the two first dummy gate lines and the two second dummy gate lines are respectively away from the boundary line by a same distance S, the first conductivity type and the second conductivity type are opposite, the edge of the first active region is away from the boundary line by a distance D1, the edge of the second active region is away from the boundary line by a distance D2, and the length L1, the length L2, the distance S, the distance D1 and the distance D2 comprise the relationships:

$L1 \leq D1-S;$ $L2 \leq D2-S;$ and $D1 \neq D2.$

2. The integrated circuit layout according to claim 1, wherein the first standard cell and the second standard cell have a same cell height along the second direction.

3. The integrated circuit layout according to claim 1, wherein the length L2 is equal to or larger than the length L1.

4. The integrated circuit layout according to claim 1, wherein the two first dummy gate lines and the two second dummy gate lines comprise a same dummy gate line length along the second direction.

5. The integrated circuit layout according to claim 1, wherein a gate line length of the first gate line along the second direction and a dummy gate line length of the two first dummy gate lines along the second direction are the same.

6. The integrated circuit layout according to claim 1, wherein a gate line length of the second gate line along the second direction is smaller than a dummy gate line length of the two second dummy gate lines along the second direction.

7. The integrated circuit layout according to claim 1, wherein the first gate line is away from the boundary line by a distance S1, and the second gate line is away from the boundary line by a distance S2, wherein the distance S1 and the distance S2 are equal to or larger than the distance S, respectively.

8. The integrated circuit layout according to claim 1, wherein the first standard cell comprises a plurality of the first gate lines disposed on the first active region and arranged along the first direction, and the second standard cell comprises a plurality of the second gate lines disposed on the second active region and arranged along the first direction, wherein at least a portion of the first gate lines are aligned to at least a portion of the second gate lines along the second direction.

9. The integrated circuit layout according to claim 8, wherein line ends of the first gate lines are aligned with each other along the first direction.

10. The integrated circuit layout according to claim 1, wherein the two first dummy gate lines are aligned to the two second dummy gate lines along the second direction.

* * * * *